United States Patent
Moore

(10) Patent No.: US 6,943,636 B2
(45) Date of Patent: Sep. 13, 2005

(54) OSCILLATOR FOR SERDES

(75) Inventor: Charles Everett Moore, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 18 days.

(21) Appl. No.: 10/640,444

(22) Filed: Aug. 13, 2003

(65) Prior Publication Data

US 2005/0046501 A1 Mar. 3, 2005

(51) Int. Cl.[7] .............................. H03B 5/12; H03M 9/00
(52) U.S. Cl. ........................... 331/117 FE; 331/108 D; 331/117 R; 331/179; 331/182; 341/100; 341/101
(58) Field of Search ................................ 331/74, 117 R, 331/117 FE, 117 D, 108 C, 108 D, 167, 179, 182–183; 341/100–101

(56) References Cited

U.S. PATENT DOCUMENTS

| 6,259,325 | B1 | * | 7/2001 | Ishizuka et al. ............ 330/301 |
| 6,323,736 | B2 | | 11/2001 | Jansson |
| 6,542,043 | B1 | | 4/2003 | Cao |
| 2003/0146816 | A1 | | 8/2003 | Furumiya et al. |

FOREIGN PATENT DOCUMENTS

| EP | 1363390 A1 | 11/2003 |
| WO | WO02/056456 A1 | 7/2002 |

* cited by examiner

*Primary Examiner*—David Mis

(57) ABSTRACT

An LC voltage controlled oscillator for use in a SERDES. The oscillator comprises a pair of cross coupled field effect transistors coupled with a pair of multi-layer inductors.

15 Claims, 4 Drawing Sheets

OSCILLATOR FOR SERDES

BACKGROUND OF THE INVENTION

FIG. 1 is a block diagram of a serializer-deserializer (SERDES) 10. The SERDES 10 comprises a serializer 12 with a dedicated deserializer 14. The serializer 12 and deserializer 14 work together to achieve high bandwidth communication through stringent timing of components and reproducible signal positioning. In general, SERDES offer increased throughput by compressing numerous data inputs into differential pairs. A plurality of signals 16 enter the serializer "horizontally" and are "vertically" aligned such that in one clock period, one set of parallel bits (typically a single word of data) is transmitted serially over a pair of transmission lines 18. The deserializer 14 receives horizontally aligned signal and re-constitutes them horizontally onto parallel lines 20. The serializer 12 and the deserializer 14 typically communicate at gigabit speeds using differential signaling. There are many differential signaling standards such as ECL/PECL, LVDS, CML, and others.

Both the serializer 12 and the deserializer 14 operate using an internal frequency set using a clock signal. The transmit clock in the serializer 12 latches the data into the serializer 12 and is embedded in into the serial stream. At the other end, the deserializer 14 recovers the embedded clock with the help of a local clock reference. In the past, for single chip implementations, the clock signal would be shared between the serializer 12 and the deserializer 14.

The internal frequency of the serializer 12, which must be faster than the incoming data, is set based on the compression/decompression factor of the SERDES 10. For example, a 10:1 serializer would have an internal frequency approximately 10 times the data frequency. The internal frequency of the serializer 12 is typically shared with the deserializer 14 by embedding the clock frequency into the output of the serializer.

Most newer SERDES devices accept data in any format, performing coding internally, but some older versions require input data to be pre-coded using 8b/10b coding. The 8b/10b coding scheme is based on representing each byte (8 bits) as a 10-bit code. A look-up table determines which 10-bit code corresponds to each byte. Since there are four times more 10-bit codes than 8-bit codes, the codes can be assigned so that the number of ones and zeros in the serial stream is roughly balanced. This "DC balance" is an advantage when sending data across long cables or across fiber.

Some current SERDES opt for a different scheme requiring less overhead, such as the 16/18 encoding scheme used on the DS92LV16 available from NATIONAL SEMICONDUCTOR, or the 64/66 encoding scheme defined in IEEE 802.3ae. By way of example 16/18 encoding sends a 16-bit word along with a start and stop bit for a total of 18 bits for every 16-bit word (compared to 20 bits for 8b/10b). Although not DC balanced, this scheme not only uses less overhead, but provides true live insertion capability.

The serializer 12 and deserializer 14 pair is only as good as their ability to lock onto and extract clock signals. This ability is determined, in large part, to the quality of the internal oscillators used to generate internal clock signals.

FIG. 2 is a block diagram of a phase locked loop (PLL) 30. In the serializer 12, the PLL locks to an input clock frequency and outputs a clock signal, e.g. the internal frequency, that is a multiple of the clock frequency. In the deserializer 14, a PLL is used in the clock recovery circuit to lock onto the embedded clock signal from the serializer 12.

In the generalized diagram of the PLL 30 shown in FIG. 2, a clock signal (CLOCK) is supplied to a phase detector 32 that detects a phase delta value between the CLOCK and a feedback signal. The delta is fed to a filter 34 which controls the voltage supplied to a voltage controlled oscillator (VCO) 36. In FIG. 2, the VCO 36 is shown as a ring oscillator. A ring oscillator may be coarsely tuned by switching in or out buffer stages and fine tuned using a varactor or by controlling the bias current in the buffers. A transfer function 38 sets the final ration of the CLOCK to the PLL frequency. The internal frequency of the PLL, as set by the ring oscillator 36, is responsible for timing for both serialization and clock recovery.

Most recent SERDES designs use full or partial digital PLLs to produce a locked clock signal. It has proven difficult to integrate an analog PLL into a noisy digital environment. In an all digital PLL, the phase detector is digital, such as a standard type IV detector or a bang-bang phase detector, the filter would typically comprise a counter and a digital recursive filter, and finally, the oscillator in an all-digital PLL would be a digitally controlled oscillator (DCO), such as the ring oscillator shown in FIG. 2.

From a design and power standpoint it is desirable to integrate multiple SERDES pairs onto a single chip. This requires the integration of multiple PLLs onto the same chip. As shown above, it is known to integrate ring oscillators in a SERDES. Unfortunately, ring oscillators have proven sensitive to power supply and substrate noise, which can be high in large multi-SERDES ICs. It is also known to use LC oscillators with spiral inductors. However, spiral inductors are costly in terms of space and expense making difficult to provide each SERDES with an integrated PLL. For example, spiral inductors need to be large to achieve reasonable Q factor.

It is further desirable to allocate each serializer and deserializer its own oscillator. This has proven difficult with even just a single SERDES on a chip much less with multiple SERDES on the chip, with some implementations having more than 10 SERDES pairs on a single chip. Current designs share an oscillator among several SERDES on a single IC, but such arrangements inevitably reduce flexibility of design and incur power penalties.

Accordingly, the present inventors have recognized a need for method and apparatus to integrate multiple oscillators on a multi-SERDES chip in a manner that reduces cost and facilitates a large number of SERDES pairs.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
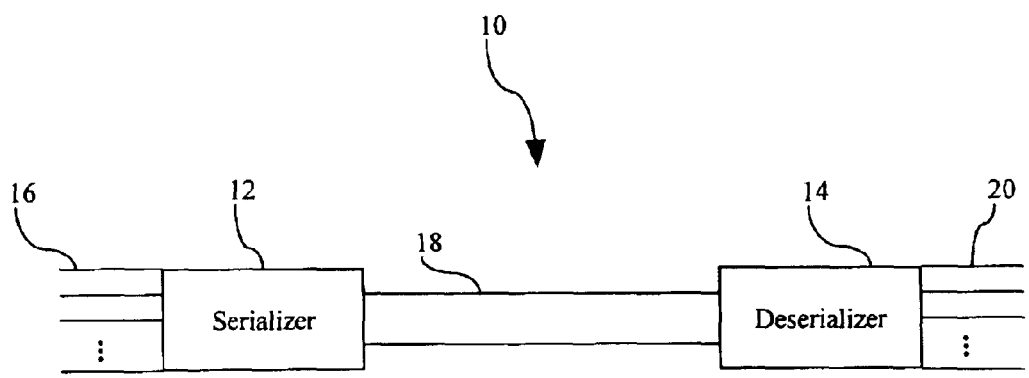
FIG. 1 is a block diagram of a known SERDES.
Figure 2:
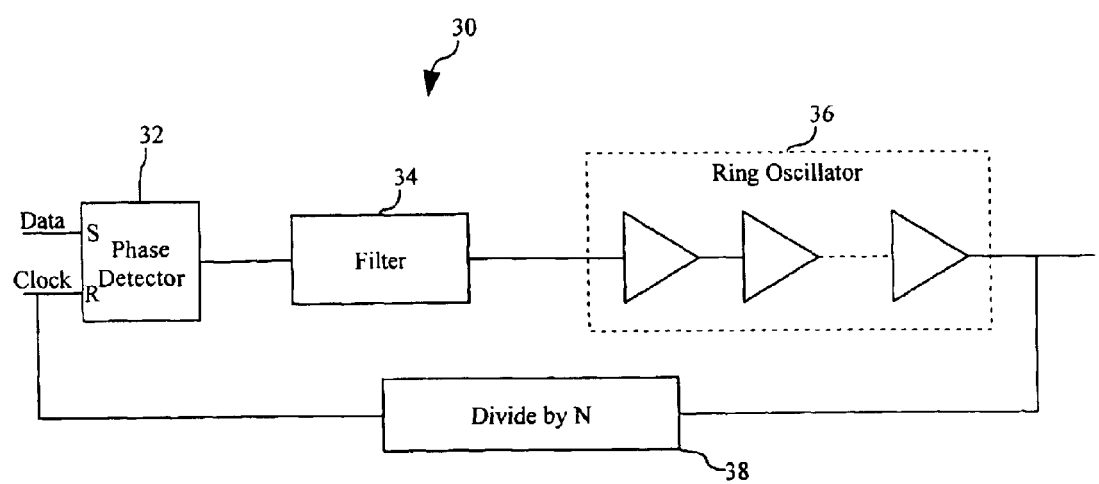
FIG. 2 is a block diagram of a phase locked loop (PLL).

Reference will now be made in detail to the present invention, examples of which are illustrated in the accompanying drawings, wherein like reference numerals refer to like elements throughout.

Figure 3A:
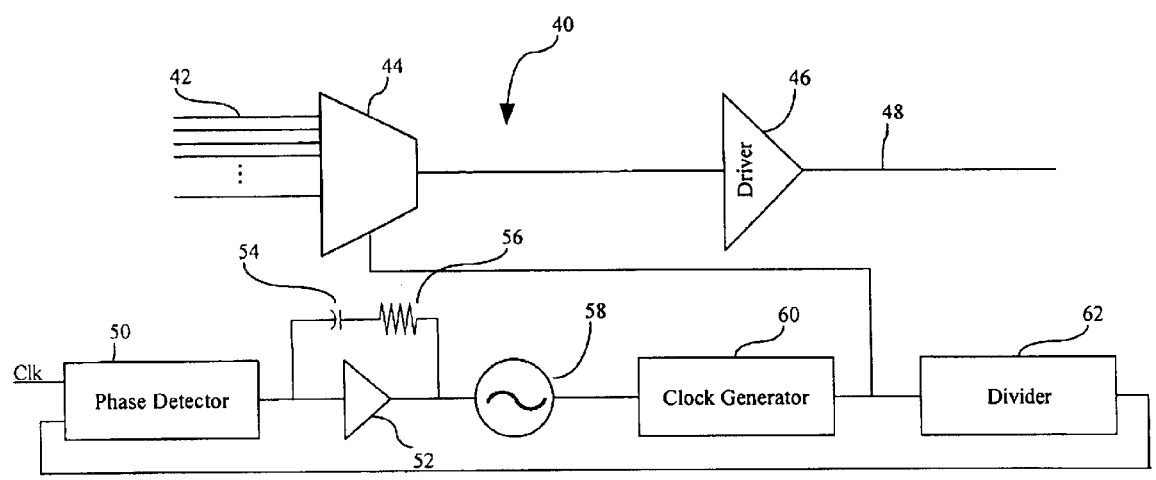
FIG. 3a is a block diagram of a transmitter for a SERDES in accordance with the preferred embodiment of the present invention.

FIG. 3a is a block diagram of a transmitter 40 for a SERDES in accordance with the preferred embodiment of the present invention. The transmitter 40 is particularly suited for integration with other transmitters and receivers (see FIG. 3b) onto a single chip. The transmitter 40 receives parallel data on signal lines 42. A Mux 44 serializes the parallel data and outputs the serial data, via a driver 46, on data line 48 (typically a differential pair). The Mux 44 operates at a timing determined by a PLL formed by a phase detector 50, voltage controlled oscillator (VCO) 58, clock generator 60 and divider 62. An amp 52 in parallel with a capacitor 54 and a resistor 56 filters the output of the phase detector 50.

Figure 3B:
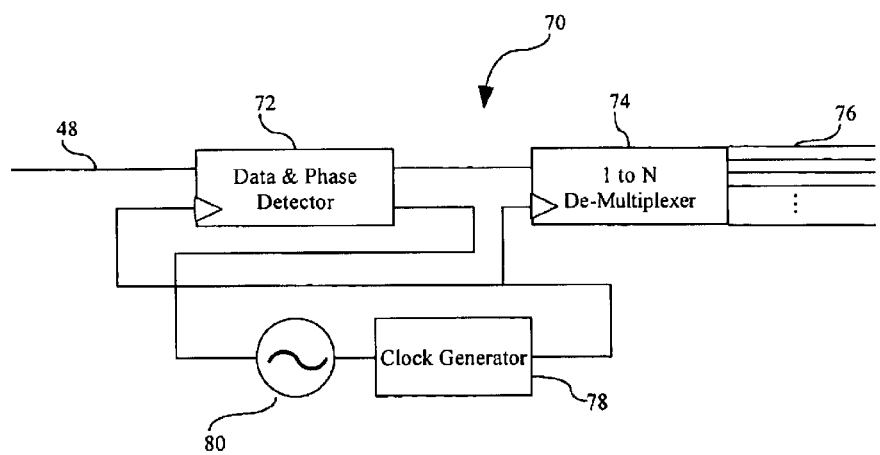
FIG. 3b is a block diagram of a receiver for a SERDES in accordance with the preferred embodiment of the present invention.

FIG. 3b is a block diagram of a receiver 70 for a SERDES in accordance with the preferred embodiment of the present invention. As with the transmitter 40, the receiver 70 is particularly suited for integration with other transmitters and receivers (see FIG. 3b) onto a single chip. The receiver 70 receives a serial signal from the transmitter 40 via the data line 48. A data and phase detector 72 extracts the data from the signal and provides a one-bit wide data signal to a de-multiplexer 74. The de-multiplexer reconstructs the parallel data signal and outputs the parallel signal via output line 76. The data and phase detector 72 and de-multiplexer 74 operate at a timing determined by a clock generator 78 that operates based on a VCO 80.

Figure 4:
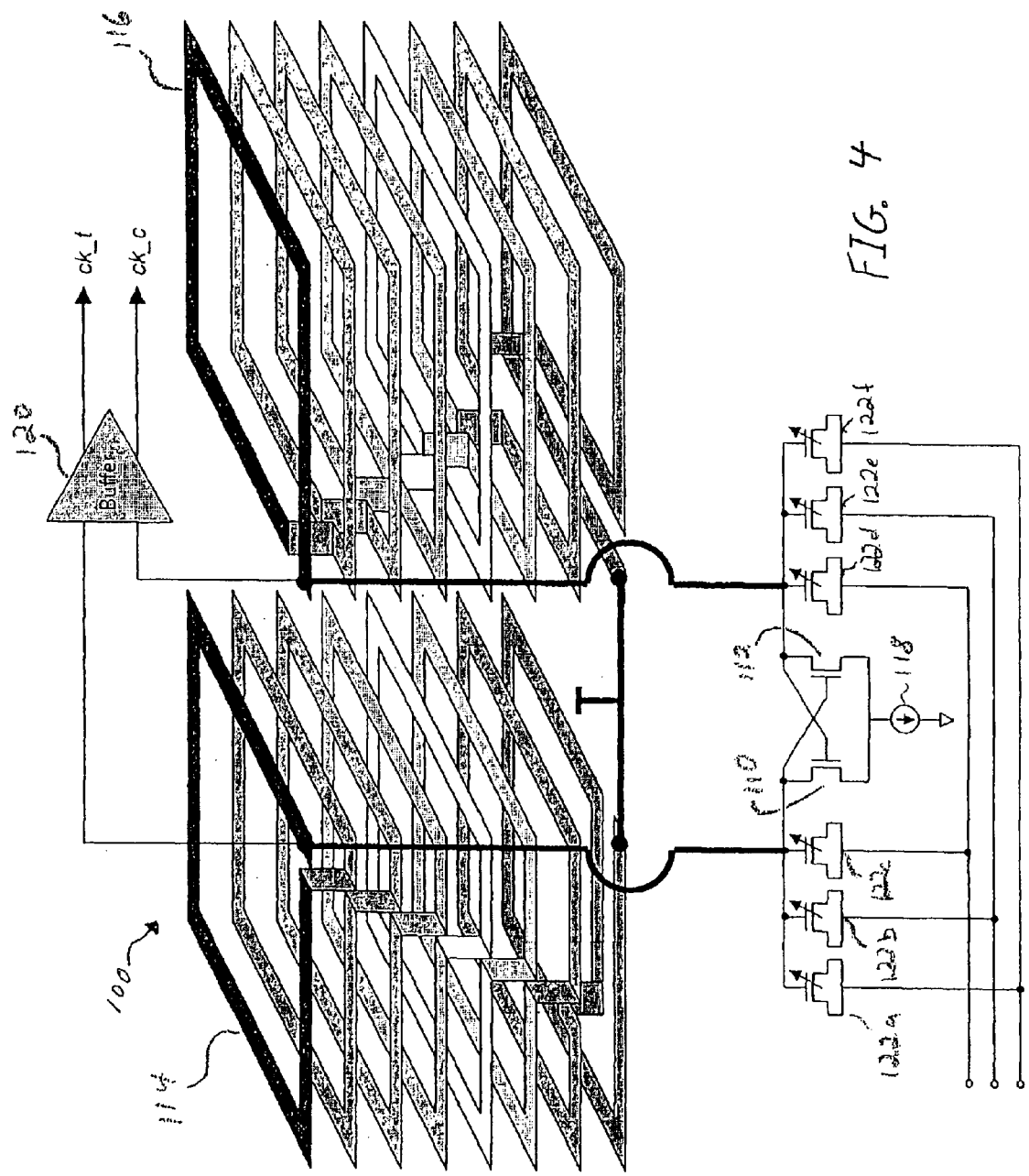
FIG. 4 is a block diagram of a VCO in accordance with a preferred embodiment of the present invention.

FIG. 4 is a block diagram of an LC VCO 100 in accordance with a preferred embodiment of the present invention. The LC VCO 100 is suitable to be adapted for use as the VCO 58 in FIG. 3a and the VCO 80 in FIG. 3b. The LC VCO is particularly suited for implementation using NMOS technology. However, those of ordinary skill in the art will recognize that other semiconductor technologies, such as CMOS and NPN bi-polar transistors may be used to implement the present invention. It will be appreciated by those of ordinary skill in the relevant arts that the LC VCO 100, as illustrated in FIG. 4, and the operation thereof as described hereinafter is intended to be generally representative such systems and that any particular system may differ significantly from that shown in FIG. 4, particularly in the details of construction and operation of such system. As such, the LC VCO 100 is to be regarded as illustrative and exemplary and not limiting as regards the invention described herein or the claims attached hereto.

The LC VCO 100 comprises a cross coupled pair of FETs 110 and 112 with an impedance tank for frequency centering. The impedance tank is formed using a pair of multilayer helically wound inductors 114 and 116. The use of multi-layer inductors 114 and 116 permit the turns to be stacked over each other in layers. Each layer may contain one or more turns, or a plurality of layers may be connected together to act as a single turn. Because the multilayer inductors 114 and 116 utilize multi metal layers, high inductance can be achieved in a smaller area than known planner spiral inductors. Thus, the multilayer inductors 114 and 116 can be fabricated much smaller than a spiral inductor with the same Q factor using CMOS technology. This permits chip designers to integrate multiple oscillators 100 on a single chip. Depending on the design specifications, separate PLLs can be provided for serialization and for clock recovery and de-serialization.

The oscillator FETs 110 and 112 are connected to an automatic gain control (AGC) 118 that controls the amplitude of the output signal. In the example shown in FIG. 3, the output is a current mode logic output providing a differential signal through a buffer 120. The frequency of the LC VCO 100 is tuned using a capacitive digital-to-analog (CDAC) switching network comprising pairs of FET varactors 122n. In essence, the resulting frequency is $\frac{1}{2} * Pi * sqrt(L*C)$, where C is the equivalent parallel capacitance of the CDACs switching network 122n. The FET varactors 122n in each pair are connected to a different side of the differential oscillator, and to a control line. While only three pairs of FET varactors 122n are shown, those of ordinary skill in the art will recognize that any number of pairs may be used, depending on the granularity of control desired. Each control line may further connect to one or more varactor pairs (not shown). As is know to those of ordinary skill in the art, some of the control lines may be controlled digitally, generally for correcting for process variation and to select one of a number of possible frequencies or frequency ranges (which may overlap). Some or all of the digital lines may actively control the frequency to help maintain phase lock. As is known, some of the control lines may be driven with analog signal(s). The details of control will depend on design practices of the designer(s) designing the PLL. Control circuits for PLLs are well known and there are many standard ways of designing them.

Although am embodiment of the present invention has been shown and described, it will be appreciated by those skilled in the art that changes may be made in such embodiment without departing from the principles and spirit of the invention, the scope of which is defined in the claims and their equivalents.

What is claimed is:

1. An LC voltage controlled oscillator for use in a SERDES, the oscillator comprising:
    a pair of cross coupled field effect transistors; and
    a pair of multi-layer inductors coupled with the cross coupled field effect transistors.

2. The LC voltage controlled oscillator, as set forth in claim 1, further comprising a plurality of capacitor digital-to-analog converters for frequency tuning the output of the oscillator.

3. The LC voltage controlled oscillator, as set forth in claim 1, further comprising an automatic gain control to adjust the amplitude of the output of the oscillator.

4. The LC voltage controlled oscillator, as set forth in claim 1, wherein the output of the oscillator is a current mode logic differential signal.

5. A SERDES comprising:
    an integrated circuit comprising:
        a serializer having a first LC VCO having a first and second multilayer inductor;
        a deserializer having a second LC VCO having a third and fourth multi-layer inductor.

6. The SERDES, as set forth in claim 5, wherein the first LC VCO further comprises a plurality of capacitor digital-to-analog converters for frequency tuning the output of the oscillator.

7. The SERDES, as set forth in claim 5, wherein the first LC VCO further comprises an automatic gain control to adjust the amplitude of the output of the oscillator.

8. The SERDES, as set forth in claim 5, wherein the first LC VCO wherein the output of the first LC VCO is a current mode logic differential signal.

9. The SERDES, as set forth in claim 5, wherein the second LC VCO further comprises a plurality of capacitor digital-to-analog converters for frequency tuning the output of the oscillator.

10. The SERDES, as set forth in claim 5, wherein the second LC VCO further comprises an automatic gain control to adjust the amplitude of the output of the oscillator.

11. The SERDES, as set forth in claim 5, wherein the output of the second LC VCO is a current mode logic differential signal.

12. An integrated circuit comprising:
   a plurality of embedded SERDES, wherein each SERDES includes a serializer and a deserializer; and
   a plurality of voltage controlled oscillators associated with the SERDES, each voltage controlled oscillator includes a pair of multi-layer inductors.

13. The integrated circuit, as set forth in claim 12, further comprising a control circuit for tuning the plurality of voltage controlled oscillators, the control circuit formed using NMOS FETS.

14. The integrated circuit, as set forth in claim 12, further comprising a control circuit for tuning the plurality of voltage controlled oscillators, the control circuit formed using CMOS circuitry.

15. The integrated circuit, as set forth in claim 12, further comprising a control circuit for tuning the plurality of voltage controlled oscillators, the control circuit formed using NPN bi-polar transistors.

\* \* \* \* \*